(12) United States Patent
Luttikhuis et al.

(10) Patent No.: US 7,256,867 B2
(45) Date of Patent: Aug. 14, 2007

(54) LITHOGRAPHIC APPARATUS AND DEVICE MANUFACTURING METHOD

(75) Inventors: Bernardus Antonius Johannes Luttikhuis, Nuenen (NL); Harmen Klaas Van Der Schoot, Vught (NL); Petrus Matthijs Henricus Vosters, Bladel (NL)

(73) Assignee: ASML Netherlands B.V., Veldhoven (NL)

( * ) Notice: Subject to any disclaimer, the term of this patent is extended or adjusted under 35 U.S.C. 154(b) by 128 days.

(21) Appl. No.: 11/018,928

(22) Filed: Dec. 22, 2004

(65) Prior Publication Data

US 2006/0132734 A1    Jun. 22, 2006

(51) Int. Cl.
*G03B 27/42* (2006.01)

(52) U.S. Cl. .............................. 355/53; 355/72; 355/75

(58) Field of Classification Search ................... 355/53, 355/72, 75
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,917,412 B2* | 7/2005 | Poon et al. ................... | 355/72 |
| 2001/0015795 A1* | 8/2001 | Nishi .......................... | 355/53 |
| 2004/0041104 A1 | 3/2004 | Liebregts et al. | |
| 2004/0130561 A1 | 7/2004 | Jain | |
| 2004/0227925 A1* | 11/2004 | Sato ............................ | 355/72 |
| 2005/0002005 A1* | 1/2005 | Terada et al. ................ | 355/53 |
| 2005/0007572 A1 | 1/2005 | George et al. | |
| 2005/0052632 A1* | 3/2005 | Miyajima .................... | 355/53 |

FOREIGN PATENT DOCUMENTS

| | | |
|---|---|---|
| WO | WO 98/33096 | 7/1998 |
| WO | WO 98/38597 | 9/1998 |

* cited by examiner

*Primary Examiner*—D. Rutledge
(74) *Attorney, Agent, or Firm*—Sterne, Kessler, Goldstein & Fox P.L.L.C.

(57) ABSTRACT

A lithographic method and apparatus comprises an illumination system that supplies a beam of radiation, a patterning device that patterns the beam, and a projection system that projects the patterned beam onto a target portion of a substrate. A metrology system is provided adjacent the projection system for aligning the substrate with the projection system. Two or more movable chucks are each arranged to support a substrate and move between a loading device and the projection system. The chucks are independently movable so that one substrate can be passed through the metrology system and patterned beam while the other substrates are moved between the loading system and projection system.

56 Claims, 7 Drawing Sheets

LITHOGRAPHIC APPARATUS AND DEVICE MANUFACTURING METHOD

BACKGROUND

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, can be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means can comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or anti-parallel to this direction.

Many scanners employ a movable chuck for supporting the substrate that passes through the patterned beam. The chuck transports the substrate from a loader to an exposure location, and passes the transport beneath the scanning apparatus. In machines of this type, it is vital that the substrate is correctly aligned with the scanning apparatus before exposure begins. Alignment, preconditioning, and measurement of the substrate consumes a significant amount of time compared to the time taken to expose the substrate. A substrate will spend approximately one third (33%) of its total time in a typical machine in metrology (e.g., measuring) and internal handling and transport, and two thirds (67%) of its time being exposed. This represents a considerable inefficiency in the operation of the machine.

Lithography machines, in particular Integrated Circuit (IC) and Flat Panel Display (FPD) machines in which the projection systems are most expensive components of the machine, suffer particularly from this problem. If these components are idle for 33% of the time, this represents a significant waste of the capacity of the machine. FPD substrates are generally very large (e.g., typically 2-3 m along each side), and accordingly the machines required to expose such substrates have a very large footprint.

Therefore, what is needed is a method and apparatus that maximize an exposure time of substrates in a lithographic apparatus and/or to minimize an increase in footprint of the lithographic apparatus when large substrates are exposed.

SUMMARY

In accordance with one embodiment of the present invention, there is provided a lithographic apparatus comprising an illumination system, a patterning device, two or more moveable chucks, a projection system, a metrology system, and a loading device. The illumination system supplies a beam of radiation. The patterning device patterns the beam. The two or more movable chucks are each arranged to support one substrate each. The projection system projects the patterned beam onto a target portion of one of the substrates. The metrology system is adjacent the projection system and aligns the substrate with the projection system as it enters the patterned beam. The loading device places the substrates onto the chucks. The chucks are independently movable, so that one substrate can be passed through the patterned beam, while the or each other substrate is moved between the loading system and projection system.

Thus in this embodiment, while one substrate is exposed, another substrate (on its respective chuck) can be moved into position ready for exposure as soon as the first substrate is finished. The projection system is therefore in use almost all of the time, greatly increasing the efficiency of the apparatus. The "idle" chuck can be transported as close as possible to the chuck supporting the substrate being exposed. Immediately after exposure, the first substrate can be transported away from the projection apparatus, while the second substrate is exposed. Because the metrology system and projection system are adjacent to each other, metrology can begin on the second substrate even as the first substrate leaves the patterned beam. In one example, the projection system and metrology system are mounted on a single frame, improving the correlation between metrology and exposure.

In one embodiment, the patterning device can comprise an array of individually controllable elements and the projection system and patterning device can together comprise an array of projection elements.

In one embodiment, a preconditioning system is provided for thermally preconditioning one of the substrates, while another substrate is passed through the patterned beam. In one example, the preconditioning system is located physically proximate to the loading device so that preconditioning can take place while the substrate is located on the loading device. In another example, the preconditioning takes place after the substrate has been placed onto its chuck.

In one example, the projection system and metrology system can be located in a first carousel lane and the loading device located in a second carousel lane. This facilitates the passing of one of the substrates through the patterned beam while another substrate is loaded onto its corresponding chuck. It also allows for the "idle" chuck to be moved into the first carousel lane following loading, to align with the projection system ready for exposure of its substrate as soon as the exposure of the first substrate is complete. Furthermore, the first substrate can then be moved quickly back into the second carousel lane (and out of the path of the second substrate) as soon as its exposure is complete. The chucks can move substantially in a circular pattern, and can all follow the same path.

In this example, the provision of two or more carousel lanes also allows for the provision of an additional metrology system located in the second carousel lane. Preparatory measurements can be performed on each substrate while it is still in the second carousel lane before it is moved to the projection system.

In one example, a base frame is provided for supporting the projection system, metrology system and chucks. The chucks can be transported rapidly around the base frame when not being exposed. In one example, each chuck can be mounted on a long stroke frame movable about the base frame using a planar drive. In one example, each chuck is movable on its corresponding long stroke frame via a short stroke actuator. This allows for precise positioning of the substrates relative to the projection system. In one example, the planar drive can comprise a coil mounted in the base frame with at least one magnet mounted in each long stroke frame. This greatly reduces the problems of cabling in a carousel. Alternatively, the base frame can comprise a magnet plate.

It will be appreciated that other forms of actuators and bearings can also be used in place of a planar drive, and that a single stroke drive can be used in place of the long stroke frames and short stroke actuators.

In one example, the chucks can be moved along the carousel lanes by intra-lane drives, and between the carousel lanes by inter-lane drives. The inter- and intra-lane drives each move the chucks in one dimension, and this again simplifies the cabling. The base frame can be formed from a plurality of subsidiary base frames.

In one example, an unloading device can be provided for removing the substrates from their respective chucks. This can be located either immediately above or immediately below the loading device. The loading and unloading devices are arranged to move the substrates on and off their respective chucks from the same side. This is desirable because each chuck can include metrology features used by the metrology system to assist the initial alignment of the chuck (and thus the substrate) relative to the projection system. These features are often located at the front edge of the chuck with respect to its passage through the patterned beam, and typically project upwards from the chuck. It is therefore not simple to move a substrate on and off the chuck across the front end over the raised metrology features. It is therefore desirable to load and unload the substrates from the rear edge of the chuck.

In one example, an additional unloading device can also be provided for receiving one of the substrates from the unloading device and unloading it from the apparatus. This allows for substrates to be loaded into the apparatus at one end and unloaded at the opposite end. In one example, the projection system and metrology system are located in a first carousel lane, and the loading device, unloading device and additional unloading device are located in a second carousel lane.

In accordance with one embodiment of the present invention, there is provided a carousel for use in a lithographic apparatus comprising an illumination and projection system for projecting a patterned beam of radiation onto a target portion of a substrate and a metrology system adjacent the projection system for ensuring the substrate is aligned with the projection system. The carousel comprises two or more chucks, each arranged to support a substrate and a loading device for placing the substrates onto the chucks. The chucks are independently movable so that one substrate can be passed through the metrology system and patterned beam while the or each other substrate is moved between the loading system and projection system.

In accordance with one embodiment of the present invention, there is provided a device manufacturing method comprising the following steps. Patterning a beam of radiation and projecting the patterned beam of radiation onto a target portion of a substrate. Providing two or more movable chucks, each arranged to support one of the substrates. Aligning a first one of the substrates with the projection system using a metrology system adjacent the projection system. Projecting the patterned beam onto a target portion of the first substrate. Providing a loading device for placing the substrates onto the chucks. Moving a second one of the substrates between the loading device and the projection system, while the patterned beam is projected onto the first substrate.

In one example, the substrates can be for use in manufacturing flat panel displays.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers can indicate identical or functionally similar elements.

DETAILED DESCRIPTION OF THE EMBODIMENTS

Overview and Terminology

Figure 1:
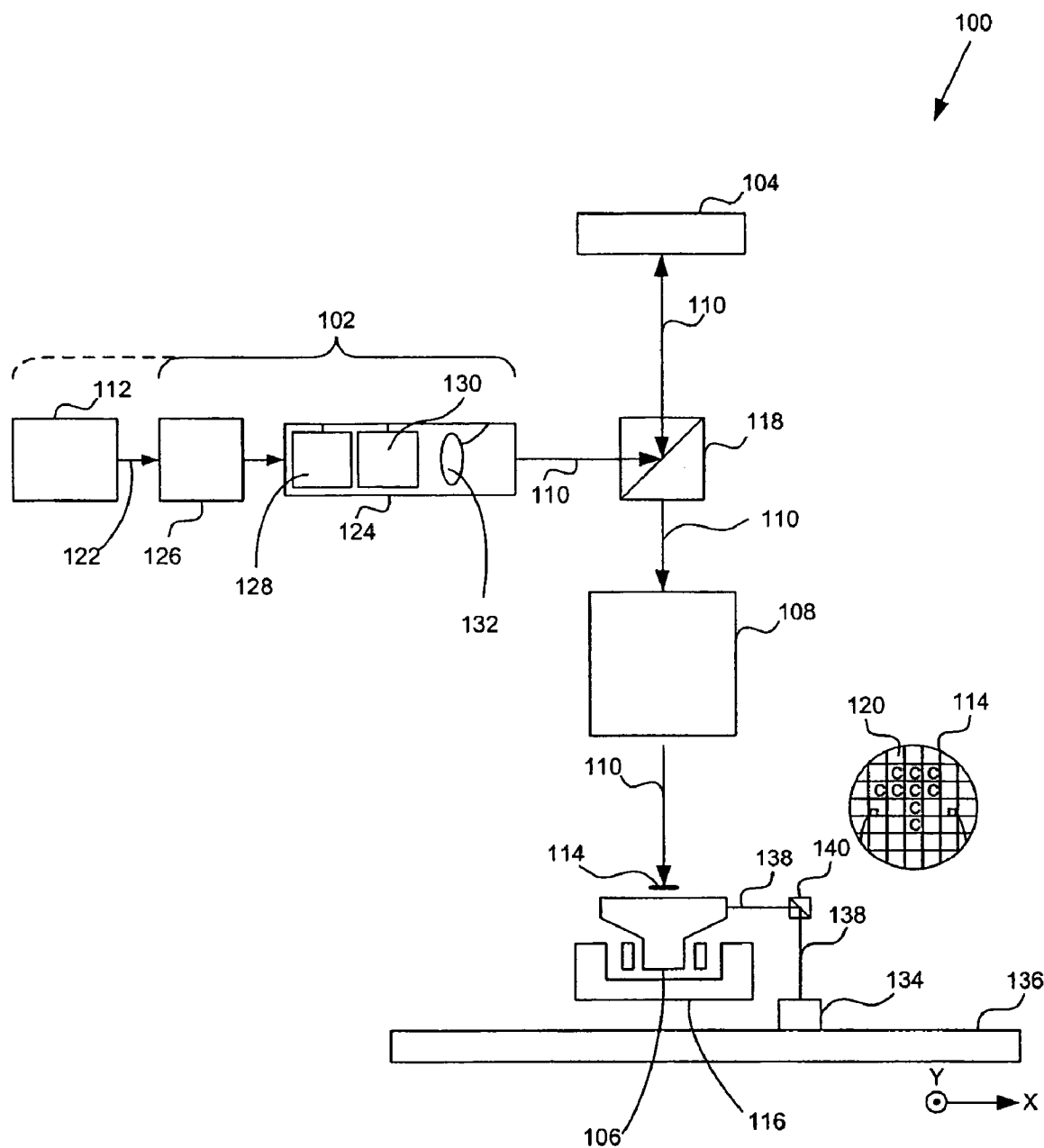
FIG. 1 depicts a lithographic apparatus, according to one embodiment of the present invention.

Throughout the remainder of this specification the terms "alignment mark" and "alignment marks" will be used to denote one or more individual, indiscrete alignment marks respectively, unless otherwise stated. By "individual" it is meant that each alignment mark is separate and distinct from others of its kind (i.e., from the other alignment marks). By "indiscrete" it is meant that each alignment mark is not divided into parts (e.g., each alignment mark is a single, undivided entity). A variety of such marks can be used in embodiments of the invention, and it will be appreciated that the dots, spots, and lines referred to in this specification are merely specific examples. Other forms can be used.

Although specific reference can be made in this text to the use of lithographic apparatus in the manufacture of integrated circuits (ICs), it should be understood that the lithographic apparatus described herein can have other applications, such as the manufacture of integrated optical systems, guidance and detection patterns for magnetic domain memories, flat panel displays, thin-film magnetic heads, micro and macro fluidic devices, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (e.g., a tool that typically applies a layer of resist to a substrate and develops the exposed resist) or a metrology or inspection tool. Where applicable, the disclosure herein can be applied to such and other substrate processing tools. Further, the substrate can be processed more than once, for example, in order to create a multi-layer IC, so that the term substrate used herein can also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array can comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation devices. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used. For example, the pattern "displayed" on the array of individually controllable elements can differ substantially from the pattern eventually transferred to a layer of or on the substrate. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Although specific reference can be made in this text to the use of lithographic apparatus in the manufacture of ICs, it should be understood that the lithographic apparatus described herein can have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track (a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g., having a wavelength in the range of 5-20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein can be considered as synonymous with the more general term "projection system."

The illumination system can also encompass various types of optical components, including refractive, reflective, and catadioptric optical components for directing, shaping, or controlling the beam of radiation, and such components can also be referred to below, collectively or singularly, as a "lens."

The lithographic apparatus can be of a type having two (e.g., dual stage) or more substrate tables (and/or two or more mask tables). In such "multiple stage" machines the additional tables can be used in parallel, or preparatory steps can be carried out on one or more tables while one or more other tables are being used for exposure.

The lithographic apparatus can also be of a type wherein the substrate is immersed in a liquid having a relatively high refractive index (e.g., water), so as to fill a space between the final element of the projection system and the substrate. Immersion liquids can also be applied to other spaces in the lithographic apparatus, for example, between the substrate and the first element of the projection system. Immersion techniques are well known in the art for increasing the numerical aperture of projection systems.

Further, the apparatus can be provided with a fluid processing cell to allow interactions between a fluid and irradiated parts of the substrate (e.g., to selectively attach chemicals to the substrate or to selectively modify the surface structure of the substrate).

Lithographic Projection Apparatus

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or $CaF_2$ lens system or a catadioptric system comprising lens elements made from such materials, or a mirror system) can be used for projecting the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for which the elements of the array of individually controllable elements 104 act as shutters. Projection system 108 can also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander, for example. Illuminator 124 can comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, beam 110 impinging on the array of individually controllable elements 104 has a desired uniformity and intensity distribution in its cross section.

It should be noted, with regard to FIG. 1, that source 112 can be within the housing of lithographic projection apparatus 100 (as is often the case when source 112 is a mercury lamp, for example). In alternative embodiments, source 112 can also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directed using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 6 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the required relative movement.

In an alternative configuration of the embodiment, substrate table 106 can be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 can be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

Combinations and/or variations on the above described modes of use or entirely different modes of use can also be employed.

Figure 2:
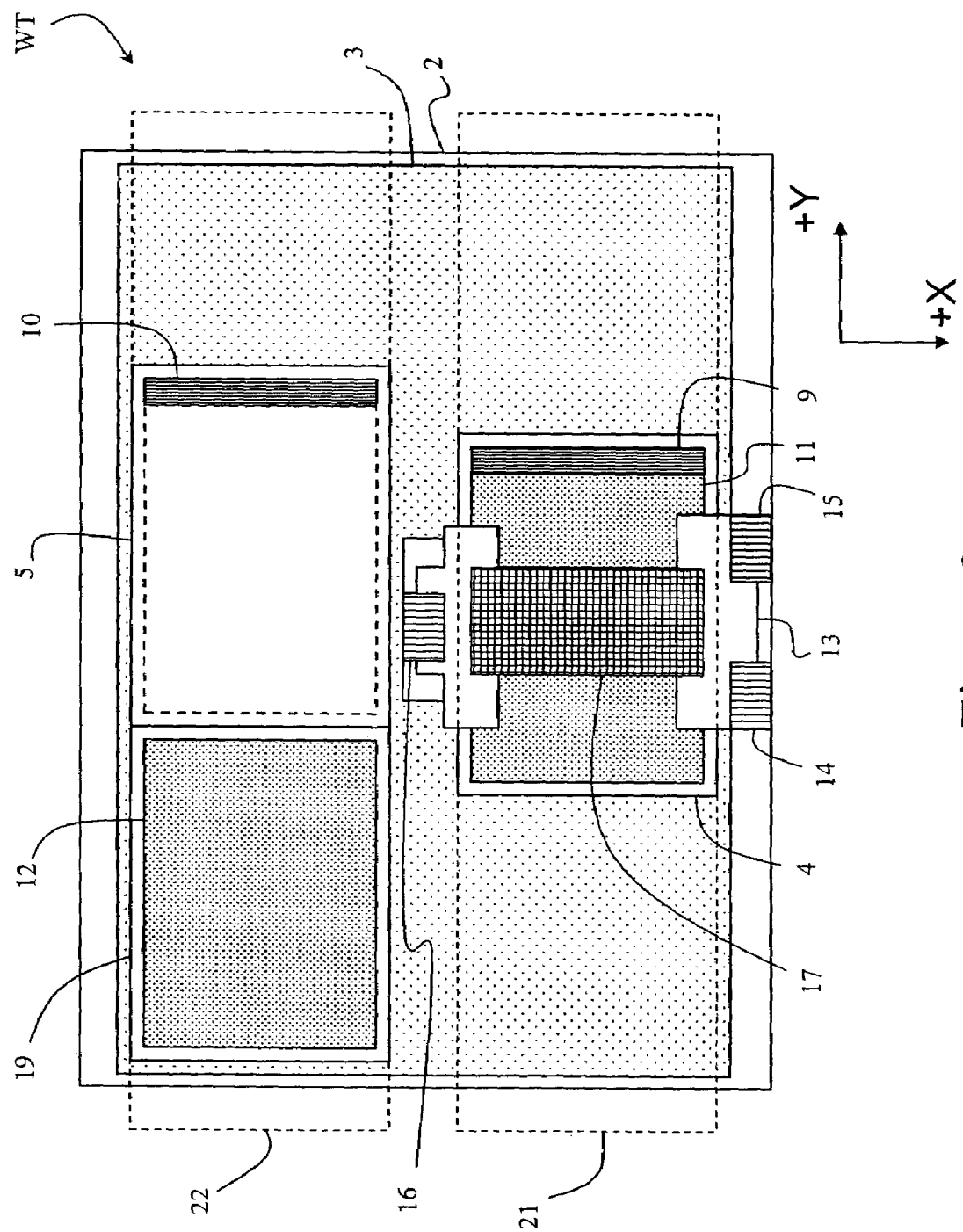
FIG. 2 is a plan view of a lithographic apparatus including two chucks, according to one embodiment of the present invention.
Figure 3:
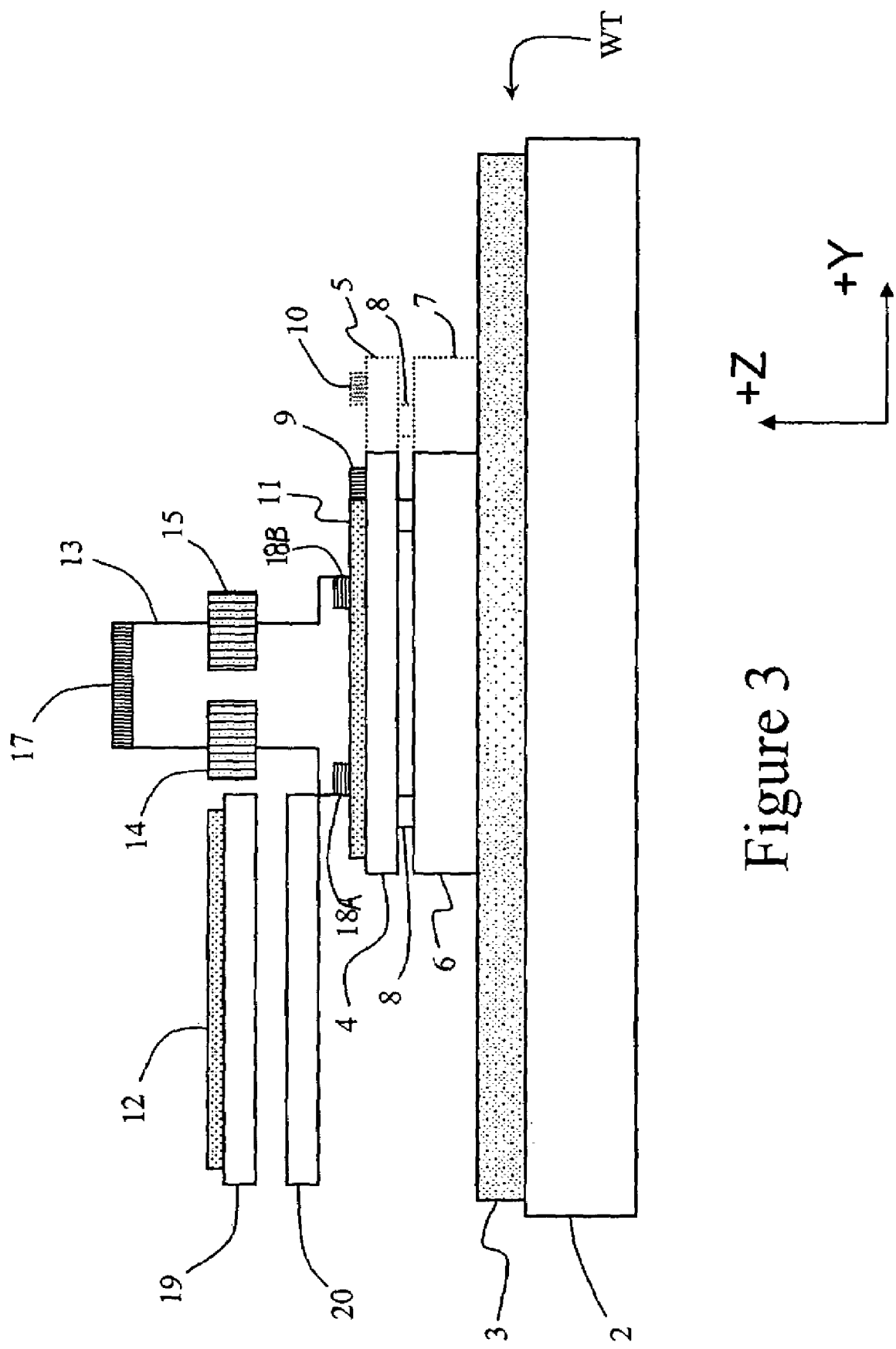
FIG. 3 is a side view of the apparatus of FIG. 2.

FIGS. 2 and 3 are plan and side views, respectively, of a lithographic apparatus, according to one embodiment of the present invention. The apparatus comprises a substrate table WT comprising a base frame 2, on which is mounted a long stroke (LS) magnet plate 3. First and second chucks 4, 5 for supporting substrates are mounted on the LS magnet plate 3 via long stroke (LS) frames 6, 7. The LS frames 6, 7 are coupled to the LS magnet plate using a planar drive (not shown), which provides contactless motion. This allows the LS frames 6, 7 to be moved around above the base frame with up to six degrees of freedom, although in one example two or three degrees of freedom are used. The chucks 4, 5 are mounted on the LS frames 6, 7 via short stroke (SS) actuators 8 which enable fine control of the positioning of the chuck. The SS actuators 8 provide, for example, three degrees of freedom for the each chuck 4, 5 with respect to the corresponding LS frame 6, 7.

Each chuck 4, 5 is provided with sensors for detecting the alignment, positioning, and level of the chuck and substrate, and the energy falling on the substrate. These sensors are represented schematically as metrology features 9, 10 on each chuck. At the stage of operation shown in FIGS. 1 and 2, a first substrate 11 is supported by the first chuck 4, but no substrate is supported by the second chuck 5.

The apparatus of FIGS. 2 and 3 additionally comprises a metroframe 13 mounted on the base frame 2 via three vibration isolation systems (VIS) 14, 15, 16. The vibration isolation systems 14, 15, 16 are, for example, air mounts, which ensure that low frequency vibrations and force disturbances are not transmitted from the base frame 2 to the metroframe 13. The metroframe 13 includes an array of projection elements 17 that perform the same function as the projection system PL and element array PPM shown in FIG. 1. The projection system elements 17 provide a patterned beam of radiation, which exposes the first substrate 11 as it passes beneath the metroframe 13. The metroframe 13 also includes metrology systems 18A, 18B for interaction with the metrology features 9, 10 on each chuck and with the substrates 11, 12. This allows for the alignment and positioning of each chuck 4, 5 and allows for substrate 11, 12 to be monitored as it passes beneath the metroframe 13.

The apparatus of FIGS. 2 and 3 also comprises a loader 19 and unloader 20 which are movable in the z-direction. At the stage shown in FIGS. 1 and 2, a second substrate 12 is located on the loader, having been placed there by an external robot (not shown). A preconditioning system (not shown) is located in the same region as the loader 19 and unloader 20 for thermal preconditioning of substrates.

The metroframe 13 is located in a first carousel lane 21 which runs in the −y-direction, whereas the loader 19 and the unloader 20 and preconditioning system are located in a second carousel lane 22 parallel to the first.

In use, the first substrate 11 mounted on the first chuck 4 moves slowly to the right along the first carousel lane 21 under the metroframe 13 and is exposed by the projection elements 17. While this exposure takes place, a number of separate operations are performed on the second substrate 12, as shown in FIGS. 4A to 4K. It is to be appreciated that the apparatus shown in FIGS. 4A to 4K is the same as that shown in FIGS. 2 and 3, but illustrated in a simplified form for clarity.

FIGS. 4A to 4K depict a sequence of stages during the operation of the apparatus of FIG. 2, according to one embodiment of the present invention.

Figure 4A:
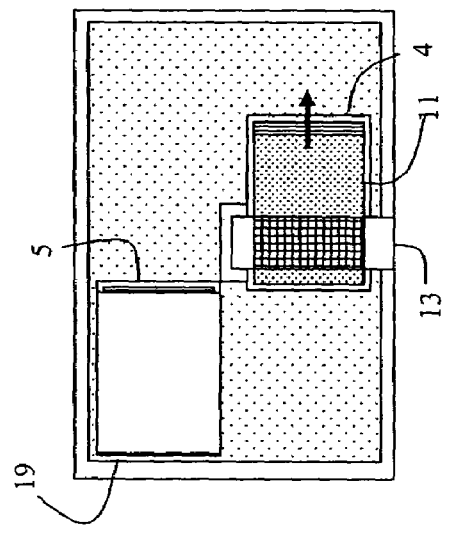
FIGS. 4A to 4K depict a sequence of stages during the operation of the apparatus of FIG. 2, according to one embodiment of the present invention.

As shown in FIG. 4A, while exposure of the first substrate 11 takes place the second substrate 12 is placed on the loader 19 by the external robot. The loader 19 and unloader 20 are then lowered so that the top of the loader 19 is level with the top of the second chuck 5.

Figure 4B:
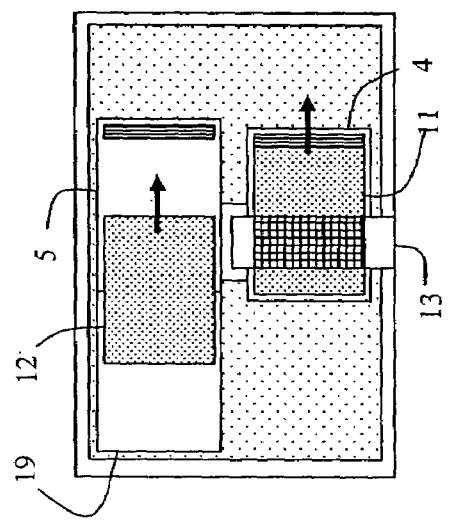

As shown in FIG. 4B, the second substrate 12 is transferred from the loader 19 to the second chuck 5. The loader 19 and unloader 20 are then raised.

Figure 4C:
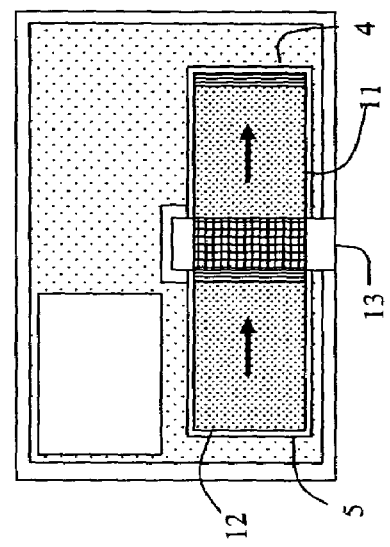

As shown in FIG. 4C, the second chuck 5 (now supporting the second substrate 12) is moved to the left along the second carousel lane 22 until it is positioned underneath the loader 19 and in the preconditioning system, enabling the second substrate 12 to undergo thermal preconditioning.

Figure 4D:
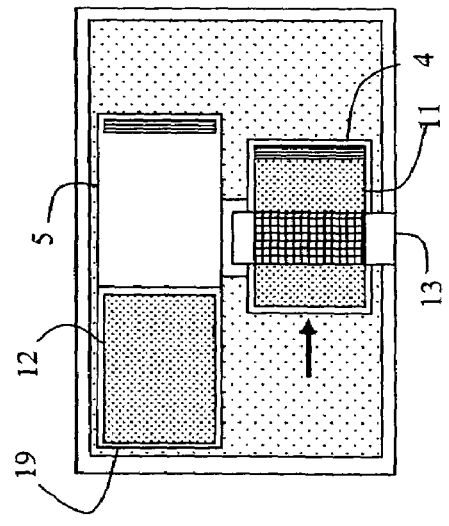
Figure 4E:
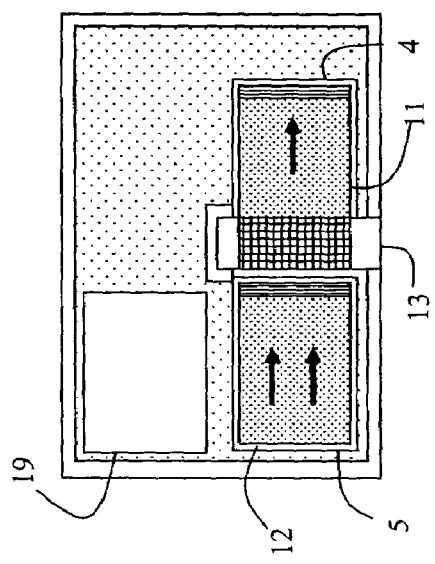

As shown in FIG. 4D, the second chuck 5 is moved in the x-direction out of the second carousel lane 22 and into the first carousel lane 21 behind the first chuck 4. The second chuck 5 is then moved relatively rapidly in the y-direction along the first carousel lane 21 to close the gap to the first chuck 4, as shown in FIG. 4E.

Figure 4F:
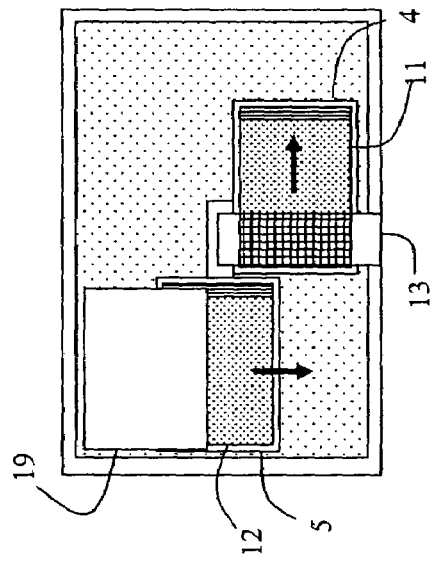

As shown in FIG. 4F, when the second chuck 5 reaches the metroframe 13 it starts moving slowly (at the same speed as the first chuck 4) so that alignment and metrology of the second chuck 5 can begin even as the exposure of the first substrate 11 is completed.

Figure 4G:
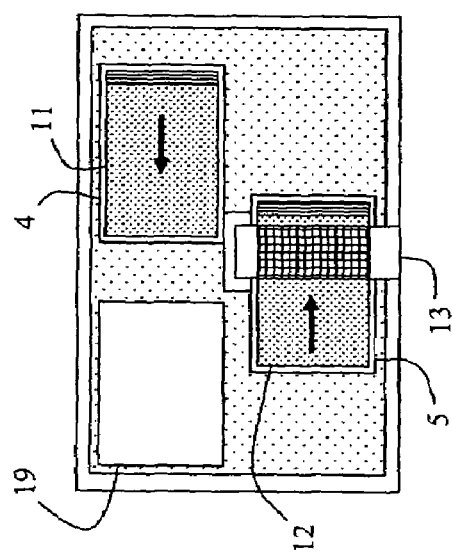

As shown in FIG. 4G, as soon as the exposure of the first substrate 11 is complete, the first chuck 4 moves relatively rapidly in the y-direction along the first carousel lane 21. Exposure of the second substrate 12 begins.

Figure 4H:
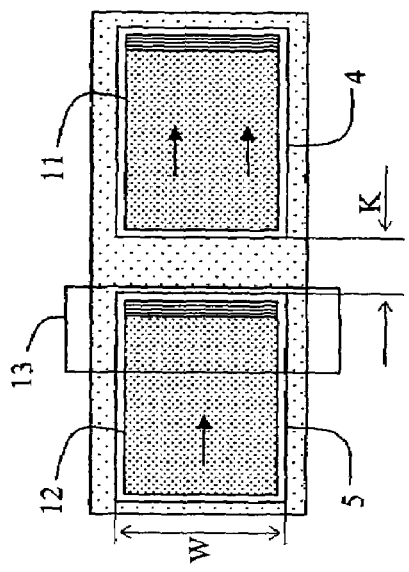

As shown in FIG. 4H, the first chuck 4 moves in the x-direction from the first carousel lane 21 to the second carousel lane 22 so as to get out of the path of the second chuck 5 as it moves beneath the metroframe 13. Exposure of the second substrate 12 continues.

Figure 4I:
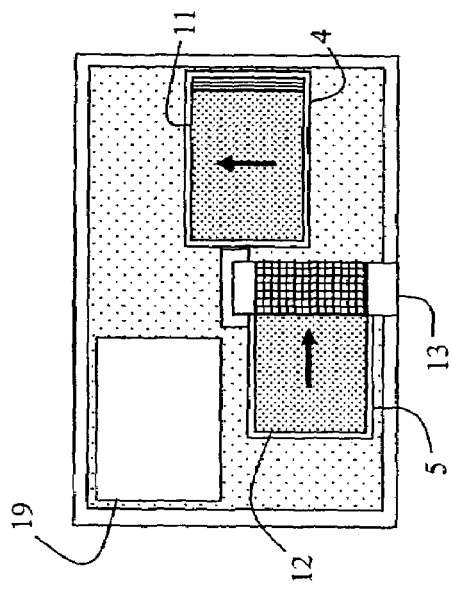

As shown in FIG. 4I, the first chuck 4 now returns in the y-direction along the second carousel lane 22 towards the loader 19 and unloader 20. Exposure of the second substrate 12 continues.

Figure 4J:
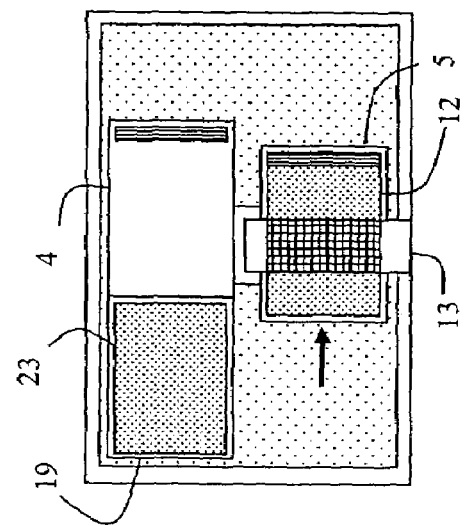

As shown in FIG. 4J, when the first chuck 4 reaches the unloader 20, the unloader 20 is lowered so that the top of the unloader 20 is level with the top of the first chuck 4. The first substrate 11 is then transferred from the first chuck 4 to the unloader 20. From there it is transferred off the apparatus using a robot (not shown).

Figure 4K:
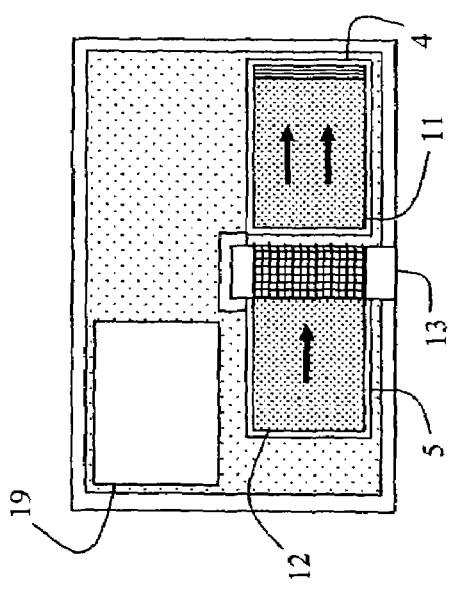

A third substrate 23 is then introduced onto the loader 19 as shown in FIG. 4K, in a manner analogous to that shown in FIG. 4A. The loader 19 is then lowered so that the top of the loader 19 is level with the top of the first chuck 4. The third substrate 23 is then transferred to the first chuck 4 and the cycle begins again, with the first chuck 4 carrying the third substrate 23 to the metroframe 13 while the second substrate 12 is exposed.

Figure 5:
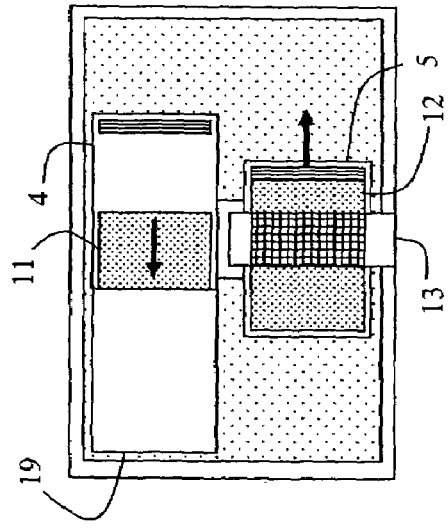
FIG. 5 shows part of the apparatus of FIG. 2, according to one embodiment of the present invention.

FIG. 5 shows part of the apparatus of FIG. 2, according to one embodiment of the present invention.

Consideration must be given to the y-separation K of the chucks 4, 5 when they are both in the first carousel lane 21, as shown in FIG. 5. In FIG. 4F the second chuck 5 moves under the metroframe 13 for metrology to begin even as exposure on the first substrate 11 is completed. This is the point at which the chucks are closest together and they are separated by $K_{min}$, which is about 50 mm, for example.

At the point shown in FIG. 4G, the first chuck 4 should be sufficiently far away from the second chuck 5 so as to move into the second carousel lane 22 as shown in FIG. 4H without impeding the second chuck 5 as it moves under the metroframe 13.

Thus, it can be seen that at least one substrate is under the metroframe 13 being exposed substantially all (or very nearly all) of the time.

In one example, it is possible to improve the efficiency of the apparatus using an additional metrology system (not shown) in the second carousel lane 22. This allows for some preparatory metrology to be performed on the second substrate 12 before the second chuck 5 is moved to the first carousel lane 21. In one example, the additional metrology system can include, for example, a level sensor.

In the embodiment described above, it can be seen that the chucks 4, 5 essentially follow a circular path. The substrates 11, 12, 23 are loaded and unloaded from the same side of the apparatus (the left hand end in FIGS. 2-6). Such an apparatus is known as a "front load/unload" apparatus.

Figure 6:
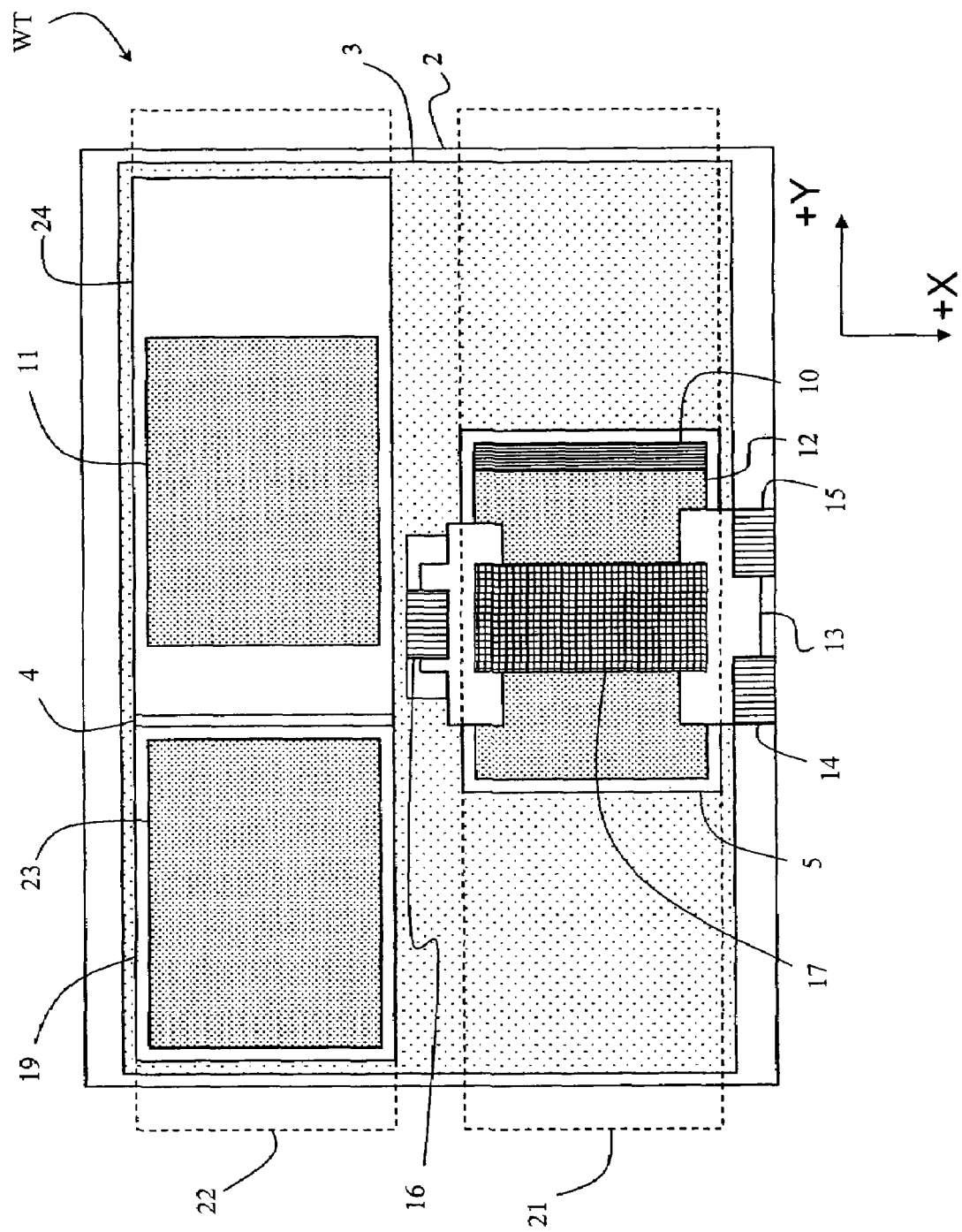
FIG. 6 is a plan view of another lithographic apparatus, according to one embodiment of the present invention.
Figure 7:
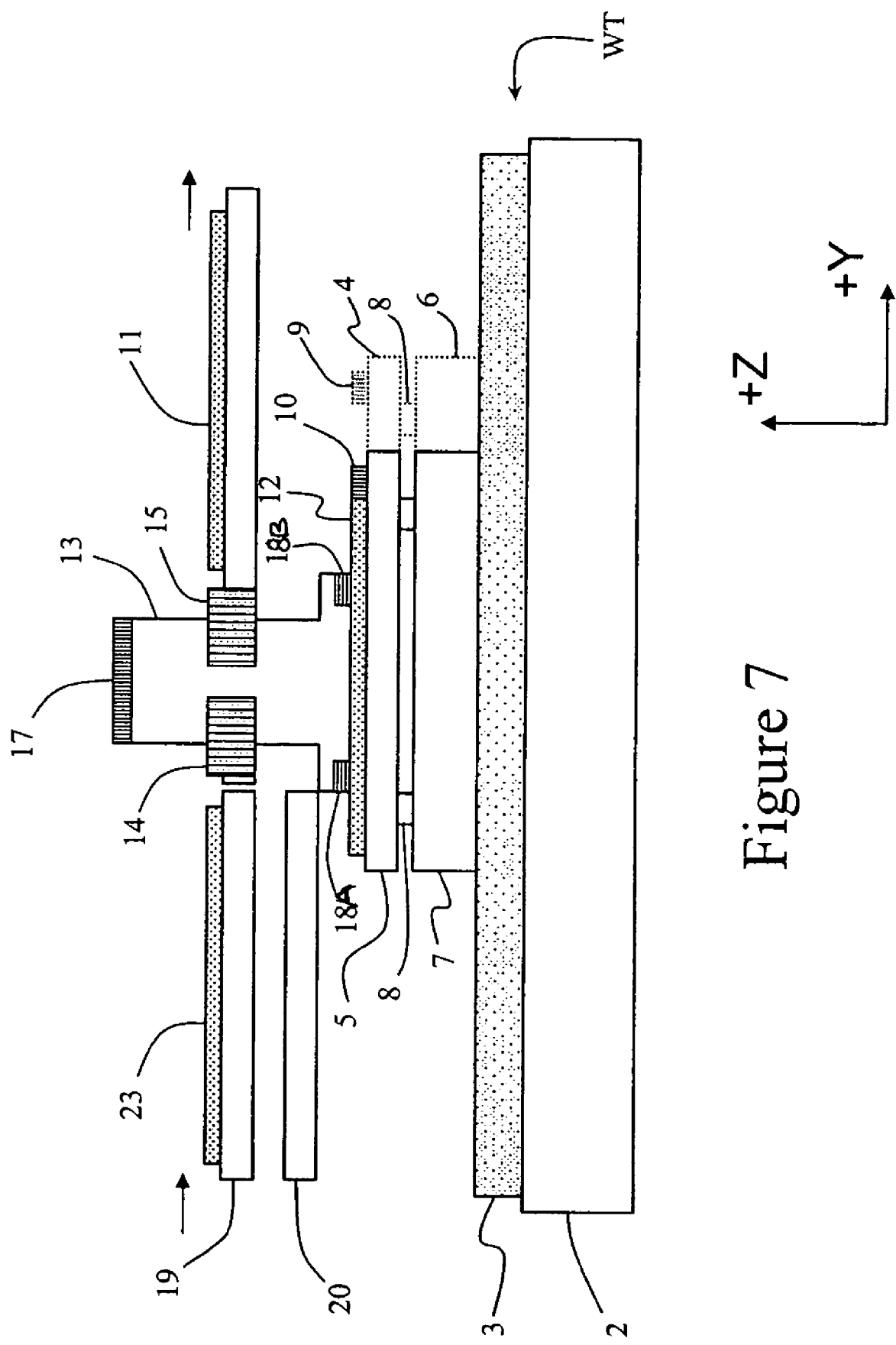
FIG. 7 is a side view of the apparatus of FIG. 6.

FIGS. 6 and 7 show a plan view and a side view, respectively, of a lithographic apparatus, according to one embodiment of the present invention. These figures show an "inline" apparatus that allows substrates to be loaded into the apparatus from one end of the apparatus and unloaded at the other end.

The apparatus shown in FIGS. 6 and 7 is similar to that of FIGS. 2, 3, 4, and 5 and is represented at a stage corresponding to the stage shown in FIG. 4K. As in FIG. 4K, the first substrate 11 has been exposed and unloaded from the first chuck 4 to the unloader 20. The second substrate 12 is in the process of being exposed. A third substrate 23 has been placed on the loader 19 by an external robot.

The apparatus of FIGS. 6 and 7 differs from FIGS. 2, 3, and 4 in that it also comprises an additional unloader 24 (FIG. 6) having a fixed z-position. Rather than unload the first substrate 11 from the unloader 20 out of the apparatus, the unloader 20 is raised to the level of the additional unloader 24 and the first substrate 11 is transferred from the unloader 20 to the additional unloader 24. The first substrate 11 is then unloaded from the apparatus from the additional unloader 24. This extra step takes place in the second carousel lane 22.

It is typically more difficult to unload directly from one of the chucks to an unloader at the right hand end of the apparatus because of the projecting nature of the metrology features 9, 10. The substrates 11, 12, 23 are thus optionally loaded onto and unloaded from the chucks 4, 5 from the left hand side, because of the presence of these metrology features.

Because the loader 19, unloader 20 and additional unloader 24 are all located in the second carousel lane 22, the length of the apparatus does not need to be increased to accommodate the "inline" loading and unloading of the apparatus. For inline apparatuses having a single chuck, the placement of the unloader 24 at the rear of the machine results in the relatively very long machine (approximately three times the length of the chuck). Inline apparatuses having two chucks are approximately twice the length of the chuck. Furthermore, the length of a "two chuck" front load/unload apparatus is equal to or longer than that of a "single chuck" front load/unload apparatus. Therefore, the "footprint," i.e., the area of the base frame, of front load/unload and inline apparatuses having two chucks is comparable with apparatuses with a single chuck. Typical substrates have widths and lengths of up to and above about 2.5 m. The width of an apparatus having two chucks (and two carousel lanes) is twice as large as that of an apparatus having a single chuck. Because single chuck inline apparatuses are so long, the total footprint of a two chuck inline apparatus is approximately 50% larger than that of a single chuck inline apparatus.

While specific embodiments of the invention have been described above, it will be appreciated that the invention can be practiced otherwise than as described. The description is not intended to limit the invention. For example, the embodiments described all relate to maskless lithography, in which an array of individually controllable elements is used to impart a pattern to the beam. However, it will be appreciated that the invention can equally well be applied to a lithographic apparatus operating with a fixed mask or reticle in place of the array of controllable elements.

Furthermore, the chucks 4, 5 have been described as being mounted via SS actuators 8 on LS frames 6, 7, themselves mounted on an LS magnet plate 3 using a planar drive. It will be appreciated that there are many possible ways to mount the chucks on the base frame to provide the necessary two or three degrees of freedom. In one example, a planar drive can be used which has a stationary coil and moving magnets, which reduces the problem of cabling in a carousel. In another example, the LS frames can be supported in the z-direction by bearings, such as fluid or air bearings or ball bearings, or by an electromagnetic force, and provided with standard LS actuators for movement in the x-y direction. In a further example, the chucks can be mounted on the base plate via a single stroke drive.

In one example, the chucks can be driven by one-dimensional "intra-lane" and "inter-lane" drives. The intra-lane drives push the chucks along the carousel lanes in the ±y-direction, and the inter-lane drives push the chucks between the carousel lanes in the ±x-direction. This provides another solution to the cabling problem by allowing the chucks to move in a circle when the drives do not.

In one example, although the loader 19 and unloader 20 are shown in FIGS. 2-7 as being located one above the other, a number of other arrangements can be envisaged. Either or both of these components can be located anywhere in the second carousel lane 22, allowing substrates to be loaded and/or unloaded from a variety of locations.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all, exemplary embodiments of the present invention as contemplated by the inventor(s), and thus, are not intended to limit the present invention and the appended claims in any way.

What is claimed is:

1. A lithographic apparatus, comprising:
an illumination system that supplies a beam of radiation;
a patterning device that patterns the beam;
two or more movable chucks, each arranged to support a corresponding substrate;
a projection system that projects the patterned beam onto a target portion of one of the substrates;
a metrology system adjacent the projection system that aligns the substrate with the projection system as it enters the patterned beam; and
a loading device that places the substrates onto the chucks,
wherein the chucks are independently movable so that one of the substrates is passed through the patterned beam, while another one of the substrates is moved between a loading system and projection system.

2. The apparatus of claim 1, wherein the patterning device comprises an array of individually controllable elements.

3. The apparatus of claim 1, wherein the projection system and the patterning device comprise an array of projection elements.

4. The apparatus of claim 1, wherein the projection system and the metrology system are mounted on a single frame.

5. The apparatus of claim 1, further comprising a preconditioning system for thermally preconditioning one of the substrates while another one of the substrates is passed through the patterned beam.

6. The apparatus of claim 5, wherein the preconditioning system is arranged in the same location as the loading device, so as to precondition one of the substrates when it is mounted on the loading device.

7. The apparatus of claim 5, wherein the preconditioning system is arranged so as to precondition one of the substrates when the substrate is placed on its corresponding chuck.

8. The apparatus of claim 1, wherein the projection system and the metrology system are located in a first carousel lane and the loading device is located in a second carousel lane, so that one of the substrates is passed along the first carousel lane through the patterned beam while, another one of the substrates is loaded onto its corresponding chuck in the second carousel lane.

9. The apparatus of claim 8, further comprising an additional metrology system located in the second carousel lane that performs preparatory measurements on each one of the substrates before the respective substrate is moved to the projection system.

10. The apparatus of claim 8, further comprising:
intra-lane drives that move the chucks along each of the first and second carousel lanes; and
inter-lane drives that move the chucks between the first and second carousel lanes.

11. The apparatus of claim 1, wherein the chucks are arranged to move substantially in a circular pattern.

12. The apparatus of claim 1, wherein all of the chucks follow a same path.

13. The apparatus of claim 1, wherein one of the chucks begins passing through the metrology system while another one of the chucks finishes passing through the patterned beam.

14. The apparatus of claim 1, further comprising a base frame for supporting the projection system, the metrology system, and the chucks.

15. The apparatus of claim 14, wherein each one of the chucks is mounted on a long stroke frame movable about the base frame using a planar drive.

16. The apparatus of claim 15, wherein each one of the chucks is movable on its corresponding one of the long stroke frames via a short stroke actuator.

17. The apparatus of claim 15, wherein the planar drive comprises a coil mounted in the base frame and at least one magnet mounted in each one of the long stroke frames.

18. The apparatus of claim 15, wherein the base frame comprises a magnet plate.

19. The apparatus of claim 14, wherein the base frame is formed from a plurality of subsidiary base frames.

20. The apparatus of claim 1, further comprising an unloading device for removing the substrates from the chucks.

21. The apparatus of claim 20, wherein the loading device and the unloading device are located one above the other.

22. The apparatus of claim 21, wherein the loading device and the unloading device are arranged to move the substrates on and off a respective one of the chucks from a same side.

23. The apparatus of claim 22, further comprising an additional unloading device for receiving one of the substrates from the first or additional unloading device and for unloading the substrate from the apparatus.

24. The apparatus of claim 23, wherein the first loading device and the additional unloading device are located at opposite ends of the apparatus, so that the substrates are loaded into the apparatus at one end of the apparatus and unloaded at the opposite end.

25. The apparatus of claim 24, wherein:
the projection system and the metrology system are located in a first carousel lane; and
the first loading device, the unloading device, and the additional unloading device are located in a second carousel lane.

26. The apparatus of claim 1, wherein the substrates are flat panel display substrates.

27. A carousel for use in a lithographic apparatus that comprises an illumination, patterning, and projection system that patterns a beam of radiation and projects the patterned beam onto a target portion of a substrate and a metrology system adjacent the projection system that ensures the substrate is aligned with the projection system, the carousel comprising:
two or more chucks, each arranged to support a corresponding one of the substrates; and
a loading device that places the substrates onto the chucks;
wherein the chucks are independently movable, so that one of the substrates is passed through the metrology system and the patterned beam, while another one of the substrates is moved between a loading system and the projection system.

28. A device manufacturing method, comprising:
patterning a beam of radiation provided by a illumination system using a patterning device;
providing two or more movable chucks, each arranged to support a corresponding substrate;
aligning a first one of the substrates with a projection system using a metrology system adjacent the projection system;
projecting the patterned beam onto a target portion of a first one of the substrates with the projection system;
placing the substrates onto the chucks using a loading device; and independently moving a second one of the substrates between the loading device and the projection system, while the patterned beam is projected onto the first substrate.

29. The method of claim 28, wherein the patterning device comprises an array of individually controllable elements.

30. The method of claim 28, wherein the projection system and the patterning device comprise an array of projection elements.

31. The method of claim 28, further comprising aligning the first substrate with the projection system as it passes into the patterned beam.

32. The method of claim 31, further comprising preconditioning the second substrate while it is mounted on the loading device.

33. The method of claim 28, further comprising thermally conditioning the second substrate while the first substrate is passed through the patterned beam.

34. The method of claim 33, further comprising preconditioning the second substrate after it has been placed onto its corresponding chuck.

35. The method of claim 28, further comprising:
locating the projection system and the metrology system in a first carousel lane; and
locating the loading device in a second carousel lane; and
loading the second substrate onto its corresponding chuck while the first substrate is passed along the first carousel lane through the patterned beam.

36. The method of claim 35, further comprising moving the second substrate from the second carousel lane into the first carousel lane while the first substrate passes along the first carousel lane and through the patterned beam.

37. The method of claim 36, further comprising moving the second substrate along the first carousel lane and aligning the second substrate with the projection system as the first substrate moves along the first carousel lane and out of the patterned beam.

38. The method of claim 36, further comprising moving the first substrate rapidly from the first carousel lane to the second carousel lane as soon as it has moved out of the patterned beam.

39. The method of claim 35, further comprising performing preparatory measurements on the second substrate, using an additional metrology system located in the second carousel lane, while the first substrate is passed along the first carousel lane through the patterned beam.

40. The method of claim 35, further comprising:
moving the chucks along the first and second carousel lanes using intra-lane drives; and
moving the chucks between the first and second carousel lanes using inter-lane drives.

41. The method of claim 28, further comprising moving the chucks substantially in a circular pattern.

42. The method of claim 28, wherein all of the chucks follow the same path.

43. The method of claim 28, further comprising supporting the projection system, the metrology system, and the chucks on a base frame.

44. The method of claim 43, further comprising:
mounting each one of the chucks on a long stroke frame; and
moving the long stroke frames about the base frame using a planar drive.

45. The method of claim 44, further comprising moving each one of the chucks on a respective one of the long stroke frames via a short stroke actuator.

46. The method of claim 44, wherein the planar drive comprises a coil mounted in the base frame and at least one magnet mounted in each long stroke frame.

47. The method of claim 44, wherein the base frame comprises a long stroke magnet plate.

48. The method of claim 43, further comprising forming the base frame from a plurality of subsidiary base frames.

49. The method of claim 28, further comprising beginning to pass one of the chucks through the metrology system while another one of the chucks finishes passing through the patterned beam.

50. The method of claim 28, further comprising removing the substrates from a respective one of the chucks using an unloading device.

51. The method of claim 50, further comprising positioning the loading device and unloading device one above the other.

52. The method of claim 51, further comprising moving the substrates on and off respective one of the chucks from a same side using the loading and the unloading devices.

53. The method of claim 52, further comprising passing one of the substrates from the unloading device to an additional unloading device.

54. The method of claim 53, further comprising:
locating the loading device and the additional unloading device at opposite ends of a base frame having mounted thereon the projection system, the metrology system, and the movable chucks;
loading each one of the substrates onto the loading device at one end of the base frame; and
unloading each one of the substrates from the additional unloading device at the opposite end of the base frame.

55. The method of claim 54, further comprising:
positioning the projection system and the metrology system in a first carousel lane; and
positioning the loading device, the unloading device, and the additional unloading device are located in a second carousel lane.

56. The method of claim 28, wherein the substrates are flat panel display substrates.

* * * * *